(12) United States Patent
Ahn

(10) Patent No.: US 7,723,801 B2
(45) Date of Patent: May 25, 2010

(54) SEMICONDUCTOR DEVICE AND METHOD OF FABRICATING THE SAME, AND NOR GATE CIRCUIT USING THE SEMICONDUCTOR DEVICE

(75) Inventor: Jung-Ho Ahn, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 219 days.

(21) Appl. No.: 11/957,255

(22) Filed: Dec. 14, 2007

(65) Prior Publication Data
US 2008/0157218 A1 Jul. 3, 2008

(30) Foreign Application Priority Data
Dec. 27, 2006 (KR) .................... 10-2006-0134831

(51) Int. Cl.
*H01L 23/495* (2006.01)
(52) U.S. Cl. .................... 257/377; 257/384; 257/629; 257/774; 257/E29.01; 257/E21.59
(58) Field of Classification Search ............... 257/377, 257/384, 629, 774, E29.01, E21.59
See application file for complete search history.

(56) References Cited

U.S. PATENT DOCUMENTS

2005/0287803 A1* 12/2005 Lee .......................... 438/672
2008/0318376 A1* 12/2008 Visokay .................... 438/233
2009/0017630 A1* 1/2009 Lee et al. ................... 438/702

* cited by examiner

*Primary Examiner*—Long K Tran
(74) *Attorney, Agent, or Firm*—Sherr & Vaughn, PLLC

(57) ABSTRACT

A semiconductor device including a semiconductor substrate having source/drain regions, a gate electrode formed on and/or over the semiconductor substrate, spacers formed against sidewalls of the gate electrode, an interlayer insulating layer formed over the semiconductor substrate and the gate electrode and having a plurality of contact holes formed therein, and contact plugs formed within the contact holes. The contact plugs can include a first contact plug and a second contact plug electrically connected to the gate electrode, and a third contact plug and a fourth contact plug electrically connected to the source/drain regions.

12 Claims, 4 Drawing Sheets

SEMICONDUCTOR DEVICE AND METHOD OF FABRICATING THE SAME, AND NOR GATE CIRCUIT USING THE SEMICONDUCTOR DEVICE

This application claims priority under 35 U.S.C. 119 to Korean Patent Application No. 10-2006-0134831 (filed on Dec. 27, 2006), which is hereby incorporated by reference in its entirety.

BACKGROUND

An integrated circuit may employ numerous types of transistors. In order to obtain highly integrated devices, the size of integrated circuits has gradually decreased. Accordingly, there may also be a need to gradually reduce the size of transistors.

Figure 1:
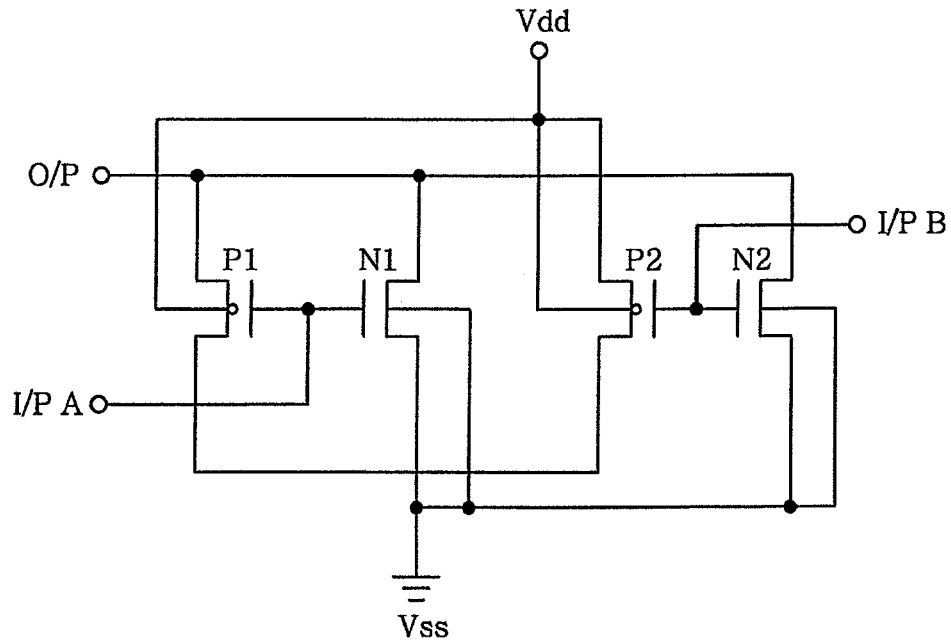

As illustrated in example FIG. 1, a 2-input NOR gate circuit may include first PMOS transistor P1 and first NMOS transistor N1, which share a first gate connected to first input I/P A, and second PMOS transistor P2 and second NMOS transistor N2, which share a second gate connected to second input I/P B.

A first source/drain junction of first PMOS transistor P1 may be connected to output line O/P. A first source/drain junction of second PMOS transistor P2 may be connected to power supply line Vdd. First PMOS transistor P1 and second PMOS transistor P2 may have second source/drain junctions connected to each other. The first source/drain junctions of first NMOS transistor N1 and second NMOS transistor N2 may be commonly connected to output line O/P. The second source/drain junctions of first NMOS transistor N1 and second NMOS transistor N2 may be commonly connected to ground supply line Vss.

Because such a NOR gate circuit may be structured to include two PMOS transistors and two NMOS transistors, achieving high integration is may be problematic.

SUMMARY

Embodiments relate to a semiconductor device including a NOR gate in which an overall chip area can be significantly reduced by reducing the number of elements necessary for the NOR gate.

Embodiments relate to a semiconductor device that can include at least one of the following: a semiconductor substrate having source/drain regions; a gate electrode formed over the semiconductor substrate; spacers formed against sidewalls of the gate electrode; an interlayer insulating layer formed over the semiconductor substrate and the gate electrode and having a plurality of contact holes formed therein; and contact plugs formed in the contact holes. In accordance with embodiments, the contact plugs include a first contact plug and a second contact plug each electrically connected to the gate electrode, and a third contact plug and a fourth contact plug each electrically connected to the source/drain regions.

Embodiments relate to a method of fabricating a semiconductor device that can include at least one of the following steps: forming a channel region and source/drain regions in a semiconductor substrate; forming a gate electrode over the semiconductor substrate; forming spacers against sidewalls of the gate electrode; forming an interlayer insulating layer over the semiconductor substrate including the gate electrode and the spacers; forming a plurality of contact holes in the interlayer insulating layer including a first contact hole and a second contact hole exposing the uppermost surface of the gate electrode, and a third contact hole and a fourth contact hole exposing the uppermost surface of the source/drain regions; and then forming a contact plug in each one of the plurality of contact holes.

Embodiments relate to a method of fabricating a semiconductor device that can include at least one of the following steps: providing a switching element including a transistor for switching an input terminal and an output terminal, wherein the transistor includes a gate and a source being grounded and a drain connected to the output terminal; and then simultaneously applying a first input signal and a second input signal to the gate of the transistor.

DRAWINGS

Figure 2:
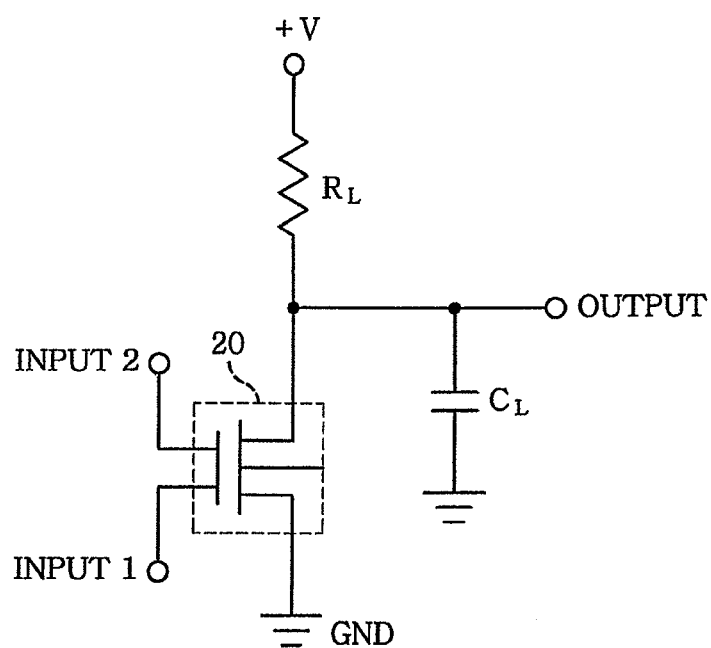

Example FIG. 1 illustrates a circuit diagram of a NOR gate.
Example FIG. 2 illustrates a circuit diagram of a NOR gate, in accordance with embodiments.
Example FIGS. 3 to 7 illustrate a method of fabricating a semiconductor device, in accordance with embodiments.
Example FIG. 8 illustrates an operation of a semiconductor device in accordance with embodiments.

DESCRIPTION

As illustrated in example FIG. 2, a NOR gate circuit in accordance with embodiments can include switching element 20 having a single transistor such as a NMOSFET or PMOSFET device. In order for the circuit to operate as a NOR gate circuit, only when a low signal is input to both first input Input 1 and second input Input 2, a high signal can be output to output terminal Output. However, when a high signal is input to both first input Input 1 and second input Input 2 or any one of first input Input 1 and second input Input 2, a low signal can be output to output terminal Output.

Specifically, in a circuit including a load resistor and an internal capacitor, if an input is applied to any one gate input terminal, a channel can be formed and an output can be connected to a ground terminal because the channel is formed in the output. Thus, a characteristic at the output becomes '0'. On the other hand, if a high signal is input through both the input terminals, a channel cannot be formed and an output terminal does not have a channel through which current can pass, so that a high state is maintained.

In such a circuit as illustrated in example FIG. 2, the amplitude of the output voltage can be great and a switching speed can be limited by $R_L$ and $C_L$. However, since internal capacitor $C_L$ can have a fixed value, it is necessary to reduce $R_L$ so as to increase the speed. Power consumption can be increased and the amplitude of the output voltage can decrease.

Since the two input terminals are formed in the gate electrode, they can be considered as independent terminals. However, in order to form a channel, if an input is applied to any one of the two input terminals, the channel can be formed and the output terminal can be maintained to a low state.

In accordance with embodiments, for switching element 20 in accordance with embodiments, two contact plugs for inputs can be electrically connected to a single gate electrode.

Figure 3:
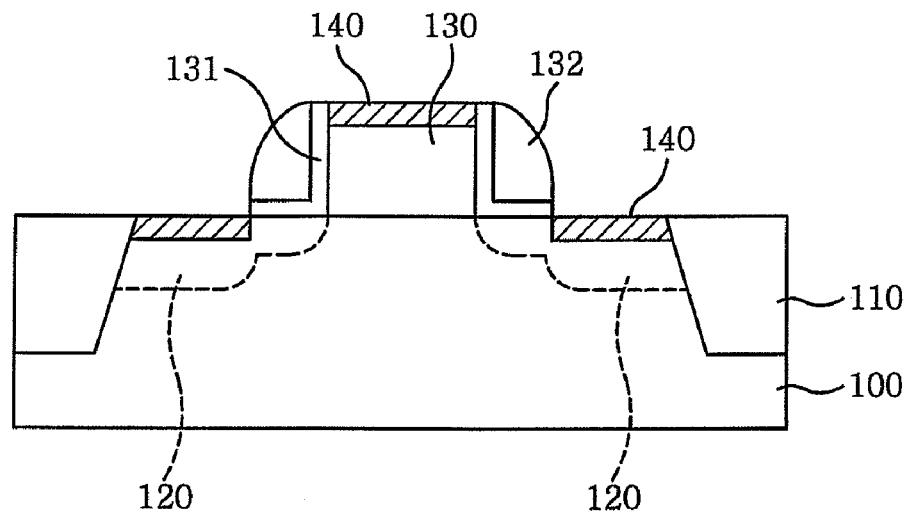

As illustrated in example FIG. 3, in accordance with embodiments, a method of manufacturing a semiconductor device can include forming isolation layers 110 defining active regions in semiconductor substrate 100. Gate electrode 130 composed of polysilicon can then be formed on and/or over semiconductor substrate 100. A gate insulating layer can be formed between gate electrode 130 and semiconductor substrate 100. Source/drain regions 120 having a light doped drain (LDD) structure can be formed in semiconductor substrate 100 spaced laterally from gate electrode 130. An impurity can be implanted in semiconductor substrate 100 to form a channel when voltage is applied to gate electrode 130. That is, before forming gate electrode 130, a channel implantation process can be carried out.

A spacer including first spacer 131 and second spacer 132 can then be formed against both sides of gate electrode 130 and on and/or over semiconductor substrate 100. Particularly, first spacer 131 can include a first, vertical portion formed against sides of gate electrode 130 and a second, lateral portion formed on and/or over semiconductor substrate 100. Second spacer 132 can then be formed on the first and second portions of first spacer 131.

After formation of source/drain regions 120, gate electrode 130, first spacer 131, second spacer 132, a silicide process for ohmic contact can then be performed. Particularly, silicide layer 140 can be formed on and/or over gate electrode 130 and source/drain regions 120.

Figure 4:
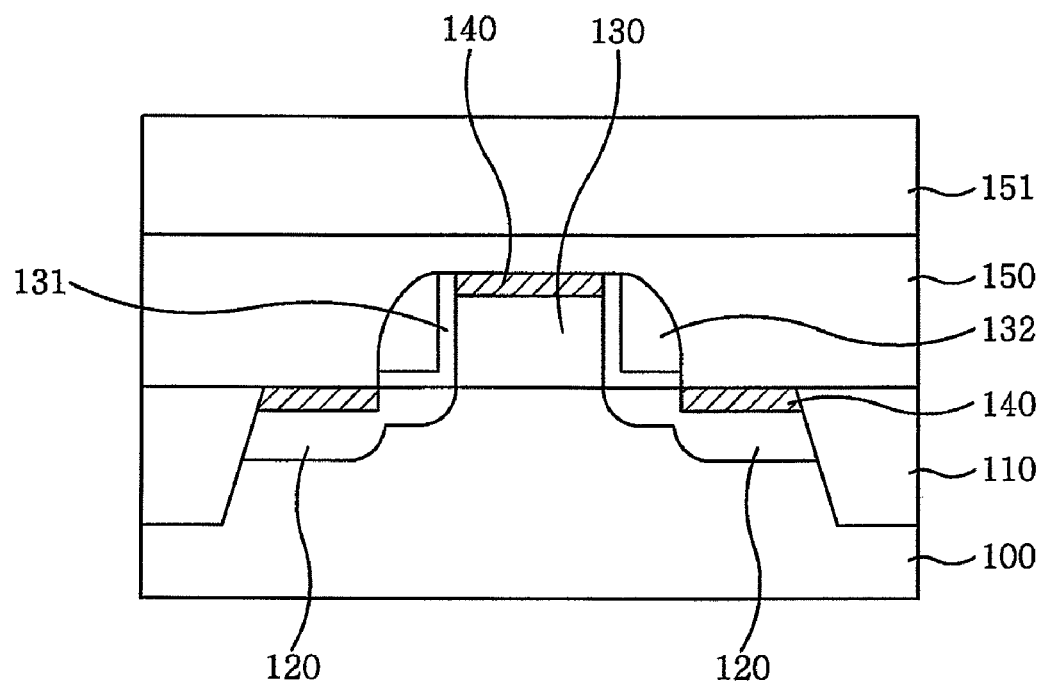

As illustrated in example FIG. 4, first interlayer insulating layer 150 can then be formed on and/or over the entire surface of semiconductor substrate 100 including silicide layer 140, second spacer 132 and isolation layers 110. Second interlayer insulating layer 151 can then be formed on and/or over first interlayer insulating layer 150. Only first interlayer insulating layer 150 can be formed to a predetermined thickness, such as between 4500 to 5500 Å.

Figure 5:
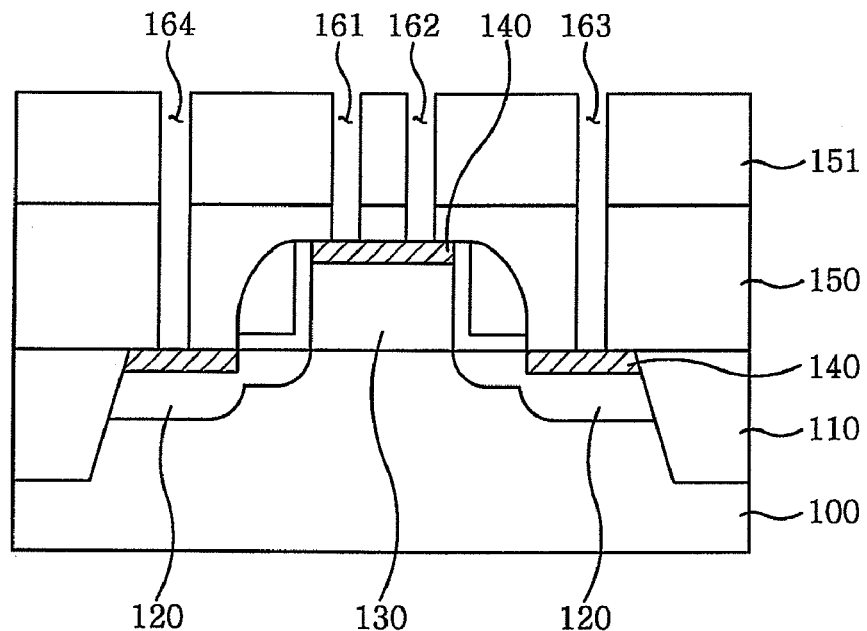

As illustrated in example FIG. 5, a photoresist can then be coated on and/or over second interlayer insulating layer 151. The photoresist can then be patterned, in order to prepare the etching of second interlayer insulating layer 151 and first interlayer insulating layer 150.

Second interlayer insulating layer 151 and first interlayer insulating layer 150 can then be etched using the patterned photoresist as an etch mask to form first contact hole 161 and second contact hole 162 exposing the uppermost surface of silicide layer 140 provided on and/or over gate electrode 130 and third contact hole 163 and fourth contact hole 164 exposing silicide layer 40 provided on and/or over source/drain regions 120.

First contact hole 161 and second contact hole 162 can have a predetermined spatial distance of 0.18 μm or more in order to prevent short between them. The distance between first contact hole 161 and second contact hole 162 can be the same as that between first contact plug 171 and second contact plug 172 that will be described later. As illustrated in example FIG. 8, the photoresist can be patterned to maximize the spatial distance between first contact hole 161 and second contact hole 162.

Figure 6:
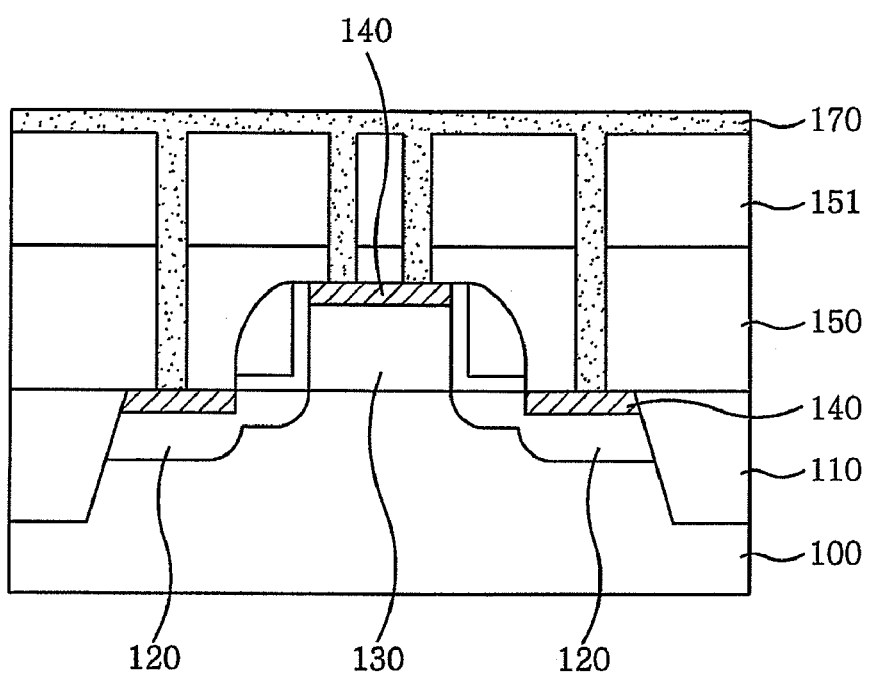

As illustrated in example FIG. 6, metal layer 170 for interlayer connection can then be deposited in first contact hole 161, second contact hole 162, third contact hole 163 and fourth contact hole 164 and then polished. Metal layer 170 can be composed of a barrier metal such as tungsten (W) or copper (Cu).

Figure 7:
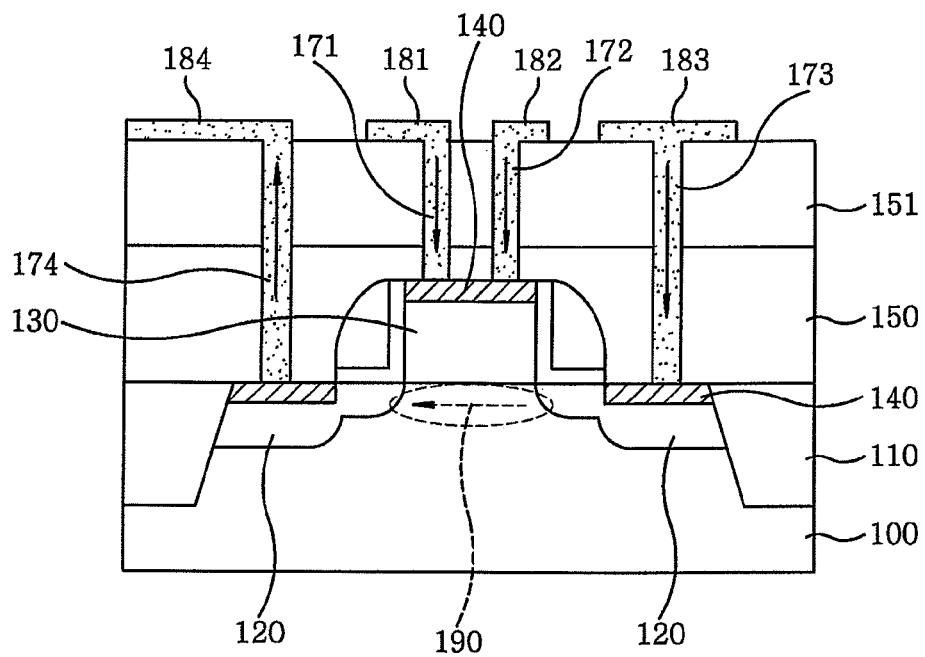
Figure 8:
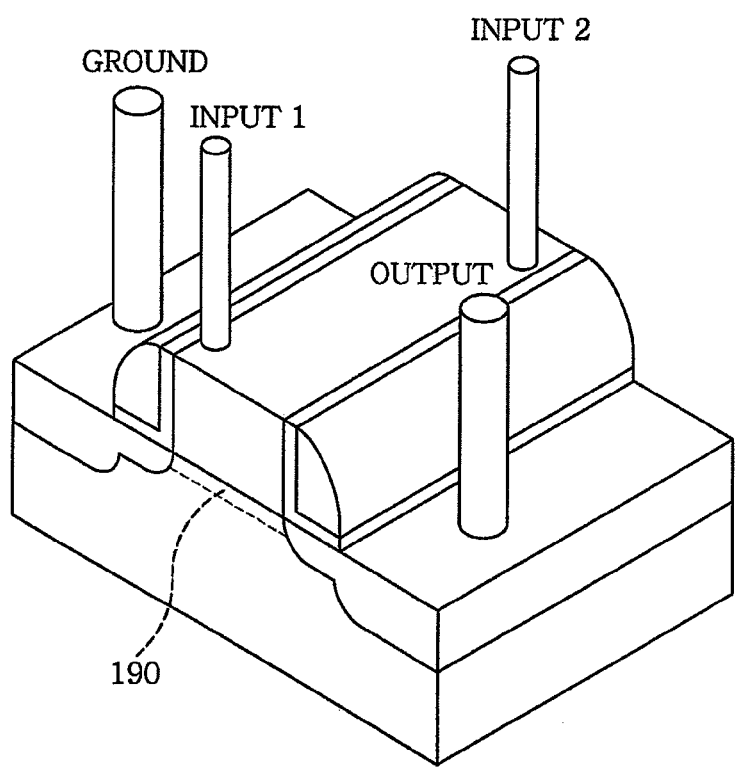

As illustrated in example FIG. 7, the polished metal layer 170 can then be patterned to form first contact plug 171 in first contact hole 161, second contact plug 172 in second contact hole 162, third contact plug 173 in third contact hole 163 and fourth contact plug 174 in fourth contact hole 164. First contact plug 171, second contact plug 172, third contact plug 173 and fourth contact plug 174 can then be patterned to form first metal wiring 181, second metal wiring 182, third metal wiring 183 and fourth metal wiring 184 thereon, respectively. Accordingly, first contact plug 171, as a first input terminal, can be formed in first contact hole 161, and second contact plug 172, as a second input terminal, can be formed in second contact hole 162. Third contact plug 173, as an output terminal, can be formed in third contact hole 163 and fourth contact plug 174, as the ground surface, can be formed in fourth contact hole 164.

Arrows illustrated in example FIG. 7 designate the flows of current when a high signal, as an input signal, is input through first contact plug 171 and second contact plug 172. In other words, if a high signal is input through the first contact plug 171 and the second contact plug 172, the third contact plug 173 is conductive to the fourth contact plug 174 (that is, the ground surface) through a channel 190 formed within the semiconductor substrate 100 under the gate electrode 130. Thus, the third contact plug 173 as an output terminal has a low signal.

As illustrated in example FIG. 8, the operation can be described in more detail below. First input Input 1 can be applied through first contact plug 171, second input Input 2 can be input through second contact plug 172, third contact plug 173 can serve as output terminal Output, and fourth contact plug 174 becomes the ground surface. The source region of semiconductor substrate 100 can be electrically connected to third contact plug 173, and the drain region of semiconductor substrate 100 can be connected to the ground surface.

It can hereinafter be assumed that signals input through first contact plug 171 and second contact plug 172 are first input Input 1 and second input Input 2, a signal monitored through third contact plug 173 can be output signal Output, and fourth contact plug 174 can be the ground surface.

TABLE

| Input 1 | Input 2 | Output |
|---------|---------|--------|
| 0 | 0 | 1 |
| 0 | 1 | 0 |
| 1 | 0 | 0 |
| 1 | 1 | 0 |

The above table can be a true table of the NOR gate provided in accordance with embodiments. As illustrated in example FIG. 8 and the table, when both the first input and the second input have a low signal, a channel is not formed below gate electrode 130. Thus, the output terminal is not conductive to the ground surface and the output signal can be maintained at a high state. The output terminal can be maintained at a high state because it is connected to parasitic capacitor $C_L$ as described above.

Moreover, when the first input has a low signal and the second input has a high signal, the channel can be formed in semiconductor substrate 100 under gate electrode 130. Thus, the output terminal can be connected to the ground surface and, therefore, the internal capacitor can be discharged, so that the output signal is in a low state.

In essence, even when any one of the two signals input through the top of gate electrode 130 (more particularly, silicide layer 140 formed on and/or over gate electrode 130) has a high signal, a channel can be formed in semiconductor substrate 100 and the output signal can be monitored as a low signal.

When the first input has a high signal and the second input has a low signal, a channel can be formed in semiconductor substrate 100, so that the output signal can be in a low state. Furthermore, when both the first input and the second input have a high signal, a channel can be formed in semiconductor substrate 100 and current can flow through the channel. Thus, the capacitor can be discharged and the output signal can be in a low state.

As described above, a NOR gate in accordance with embodiments can be constructed through the semiconductor device. In accordance with embodiments, advantages such as a reduction in overall chip area and a reduction in overall number of elements required for the NOR gate can be obtained, and thus, highly integrated semiconductor devices can be achieved.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An apparatus comprising:
   a semiconductor substrate having source/drain regions;
   a gate electrode formed over the semiconductor substrate;
   spacers formed against sidewalls of the gate electrode;
   an interlayer insulating layer formed over the semiconductor substrate and the gate electrode and having a plurality of contact holes formed therein; and
   contact plugs formed in the contact holes,
   wherein the contact plugs include a first contact plug and a second contact plug each electrically connected to the gate electrode, and a third contact plug and a fourth contact plug each electrically connected to the source/drain regions.

2. The apparatus of claim 1, further comprising a first silicide layer formed over the gate electrode, and a third silicide layer and a fourth silicide layer formed over the source/drain regions.

3. The apparatus of claim 2, wherein the first contact plug and the second contact plug are connected to the first silicide layer.

4. The apparatus of claim 2, wherein the third contact plug is connected to the third silicide layer and the fourth contact plug is connected to the fourth silicide layer.

5. The apparatus of claim 1, wherein the spacers include a first spacer and a second spacer formed over the first spacer.

6. The apparatus of claim 5, wherein the first spacer includes a first portion formed against a sidewall of the gate electrode and a second portion formed over the semiconductor substrate.

7. The apparatus of claim 1, wherein the first contact plug and the second contact plug are spaced apart from each other at a predetermined distance.

8. The apparatus of claim 7, wherein the predetermined distance is 0.18 μm or more.

9. The apparatus of claim 1, wherein the first contact plug, the second contact plug, the third contact plug and the fourth contact plug are composed of a barrier metal.

10. The apparatus of claim 9, wherein the barrier metal comprises at least one of tungsten and copper.

11. The apparatus of claim 1, wherein the interlayer insulating layer comprises a first interlayer insulating layer formed over the semiconductor substrate including the gate electrode and a second interlayer insulating layer formed over the first interlayer insulating layer.

12. The apparatus of claim 11, wherein the first interlayer insulating layer has a predetermined thickness of between 4500 to 5500 Å.

* * * * *